US012615745B2

(12) United States Patent
Takata

(10) Patent No.:  US 12,615,745 B2
(45) Date of Patent:      Apr. 28, 2026

(54) COOLING SYSTEM FOR COOLING AN AUTOMATED DRIVING CONTROLLER

(71) Applicant: DENSO CORPORATION, Kariya-city (JP)

(72) Inventor: Seiya Takata, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 224 days.

(21) Appl. No.: 18/393,346

(22) Filed: Dec. 21, 2023

(65) Prior Publication Data

US 2024/0147676 A1      May 2, 2024

Related U.S. Application Data

(63) Continuation of application No. PCT/JP2022/024208, filed on Jun. 16, 2022.

(30) Foreign Application Priority Data

Jun. 25, 2021      (JP) ................................. 2021-106093

(51) Int. Cl.
H05K 7/20 (2006.01)

(52) U.S. Cl.
CPC ..... H05K 7/20872 (2013.01); H05K 7/20236 (2013.01); H05K 7/20445 (2013.01)

(58) Field of Classification Search
CPC ........... H05K 7/20236; H05K 7/20872; H05K 7/20436–20445; H05K 1/0203
See application file for complete search history.

(56) References Cited

U.S. PATENT DOCUMENTS

| | | | |
|---|---|---|---|
| 10,099,630 B1 | 10/2018 | Krishnan et al. | |
| 10,461,657 B2 * | 10/2019 | Nakamura | ......... H05K 7/20936 |
| 11,324,147 B2 * | 5/2022 | Kobayashi | ......... H05K 7/20927 |
| 2002/0179289 A1 * | 12/2002 | Yamashita | .......... H01L 23/3737 257/E23.087 |
| 2021/0075962 A1 * | 3/2021 | Perwass | .................... G06T 3/40 |

OTHER PUBLICATIONS

Written Opinion of the ISR for PCT/JP2022/024208 (Sep. 20, 2022).*

* cited by examiner

*Primary Examiner* — Zachary Pape
(74) *Attorney, Agent, or Firm* — Precision Patents, P.C.

(57) ABSTRACT

A cooling system cools an automated driving controller that executes processing related to automated driving control of a vehicle. The cooling system includes the automated driving controller and a housing. The automated driving controller includes a preprocessing circuit module to preprocess sensor data obtained by sensing an external environment of the vehicle, and a recognition circuit module to execute recognition processing of the external environment based on the preprocessed sensor data. The housing accommodates the preprocessing circuit module and the recognition circuit module together with an insulating liquid. The preprocessing circuit module is to be air-cooled by placement outside the insulating liquid. The recognition circuit module is to be cooled by immersion in the insulating liquid.

15 Claims, 7 Drawing Sheets

FIG. 4

COOLING SYSTEM FOR COOLING AN AUTOMATED DRIVING CONTROLLER

CROSS REFERENCE TO RELATED APPLICATIONS

The present application is a continuation application of International Patent Application No. PCT/JP2022/024208 filed on Jun. 16, 2022, which designated the U.S. and claims the benefit of priority from Japanese Patent Application No. 2021-106093 filed on Jun. 25, 2021. The entire disclosures of all of the above applications are incorporated herein by reference.

TECHNICAL FIELD

The present disclosure relates to a cooling system that cools an automated driving controller.

BACKGROUND

An automated driving controller performs automatic control of a vehicle by processing an enormous amount of sensor data from a large number of sensors.

SUMMARY

According to at least one embodiment, a cooling system cools an automated driving controller that executes processing related to automated driving control of a vehicle. The cooling system includes the automated driving controller and a housing. The automated driving controller includes a preprocessing circuit module to preprocess sensor data obtained by sensing an external environment of the vehicle, and a recognition circuit module to execute recognition processing of the external environment based on the preprocessed sensor data. The housing accommodates the preprocessing circuit module and the recognition circuit module together with an insulating liquid. The preprocessing circuit module is to be air-cooled by placement outside the insulating liquid. The recognition circuit module is to be cooled by immersion in the insulating liquid.

BRIEF DESCRIPTION OF DRAWINGS

The details of one or more embodiments are set forth in the accompanying drawings and the description below. Other features and advantages will be apparent from the description and drawings, and from the claims.

FIG. 4 is a cross-sectional view illustrating a housing and the automated driving controller according to the first embodiment.

DETAILED DESCRIPTION

Figure 1:
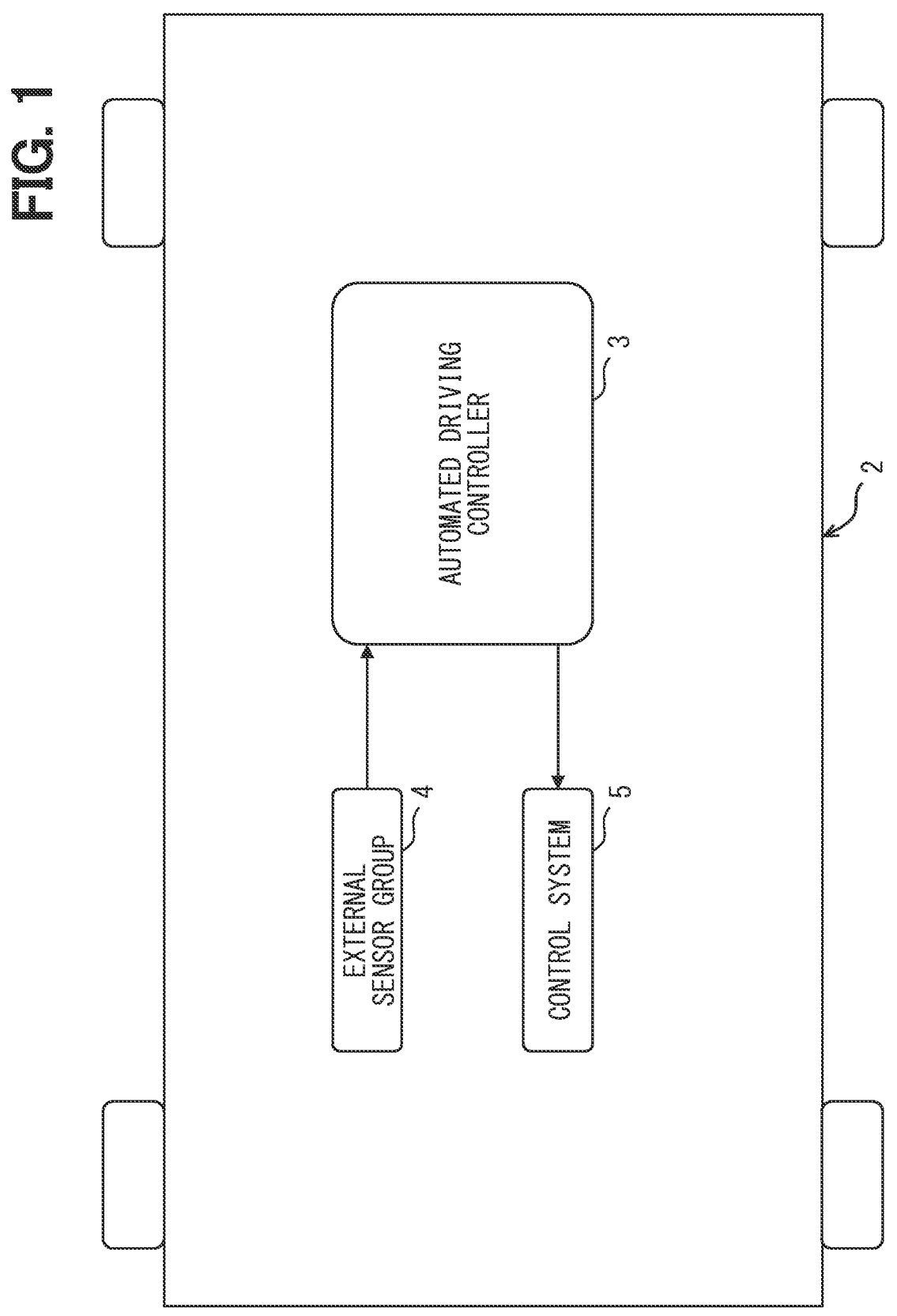
FIG. 1 is a schematic diagram illustrating a vehicle equipped with an automated driving controller according to a first embodiment.

To begin with, examples of relevant techniques will be described.

An automated driving controller disclosed according to a comparative example performs automatic control of a vehicle by processing an enormous amount of sensor data from a large number of sensors.

An automated driving controller according to the comparative example processes an enormous amount of sensor data, thereby increasing an amount of heat generated by the processing. Therefore, in order to operate the automated driving controller with high efficiency, a cool-down of the automated driving controller is necessary. As a cooling method, liquid cooling in which an automated driving controller is immersed in an insulating liquid and cooled is considered. However, in an automated driving controller that processes a huge amount of sensor data, since a circuit size increases, a large amount of insulating liquid is required to liquid-cool the entire controller.

In contrast to the comparative example, according to a cooling system of the present disclosure, an automated driving controller can be efficiently cooled while reducing an amount of insulating liquid required for liquid cooling.

According to one aspect of the present disclosure, a cooling system cools an automated driving controller that executes processing related to automated driving control of a vehicle. The cooling system includes the automated driving controller and a housing. The automated driving controller includes a preprocessing circuit module to preprocess sensor data obtained by sensing an external environment of the vehicle, and a recognition circuit module to execute recognition processing of the external environment based on the preprocessed sensor data. The housing accommodates the preprocessing circuit module and the recognition circuit module together with an insulating liquid. The preprocessing circuit module is to be air-cooled by placement outside the insulating liquid. The recognition circuit module is to be cooled by immersion in the insulating liquid.

According to this configuration, in the automated driving controller, the preprocessing circuit module is arranged outside the insulating liquid, and the recognition circuit module is immersed in the insulating liquid. According to this, the recognition circuit module that executes relatively high-load processing of the recognition processing of an outside world can be liquid-cooled by being immersed in the insulating liquid, and the preprocessing circuit module that executes relatively low-load processing of the preprocessing of the sensor data can be air-cooled by being arranged outside the insulating liquid. Therefore, a required amount of insulating liquid can be reduced and the automated driving controller can be efficiently cooled as compared to a case where the entire automated driving controller is liquid cooled.

Hereinafter, embodiments will be described with reference to the drawings. It should be noted that the same reference numerals are assigned to corresponding components in the respective embodiments, and overlapping descriptions may be omitted. When only a part of the configuration is described in the respective embodiments, the configuration of the other embodiments described before may be applied to other parts of the configuration. Further, not only the combinations of the configurations explicitly shown in the description of the respective embodiments, but also the configurations of the plurality of embodiments can be partially combined together even if the configurations are not explicitly shown if there is no problem in the combination in particular.

First Embodiment

A cooling system 1 of a first embodiment is mounted on a vehicle 2 shown in FIG. 1 and cools an automated driving controller 3. The automated driving controller 3 executes processing related to autonomous driving of the vehicle 2 based on sensor data from an external sensor group 4 including external sensors. The automated driving controller 3 is disposed in a vehicle body, on a roof, or the like of the vehicle 2.

Each external sensor of the external sensor group 4 acquires information on external environment that is periphery environment of the vehicle 2. The external sensors may acquire the external information by detecting an object existing in an outside of the vehicle 2. The external sensors of a detection type is at least one of a camera, a LIDAR (Light Detection and Ranging/Laser Imaging Detection and Ranging), a radar, sonar, and the like, for example. The external sensors may acquire external environment information by receiving positioning signals from artificial satellites of GNSS (i.e., Global Navigation Satellite System) disposed in the external environment of the vehicle 2. The external sensors of a positioning type is, for example, a GNSS receiver or the like. The external sensors may acquire external environment information by transmitting and receiving a communication signal to and from a V2X system existing outside the vehicle 2. The external sensors of a communication type is, for example, at least one of a DSRC (Dedicated Short Range Communications) communication device, a cellular V2X (C-V2X) communication device, a Bluetooth (registered trademark) device, a Wi-Fi (registered trademark) device, and an infrared communication device, for example.

The automated driving controller 3 shown in FIG. 1 is connected to the external sensor group 4 and a control system 5 via at least one of, for example, a LAN (Local Area Network), wire harness, internal bus, wireless communication line, or the like. The control system 5 is a steering controller or the like that actually controls a driving of the vehicle 2.

Figure 2:
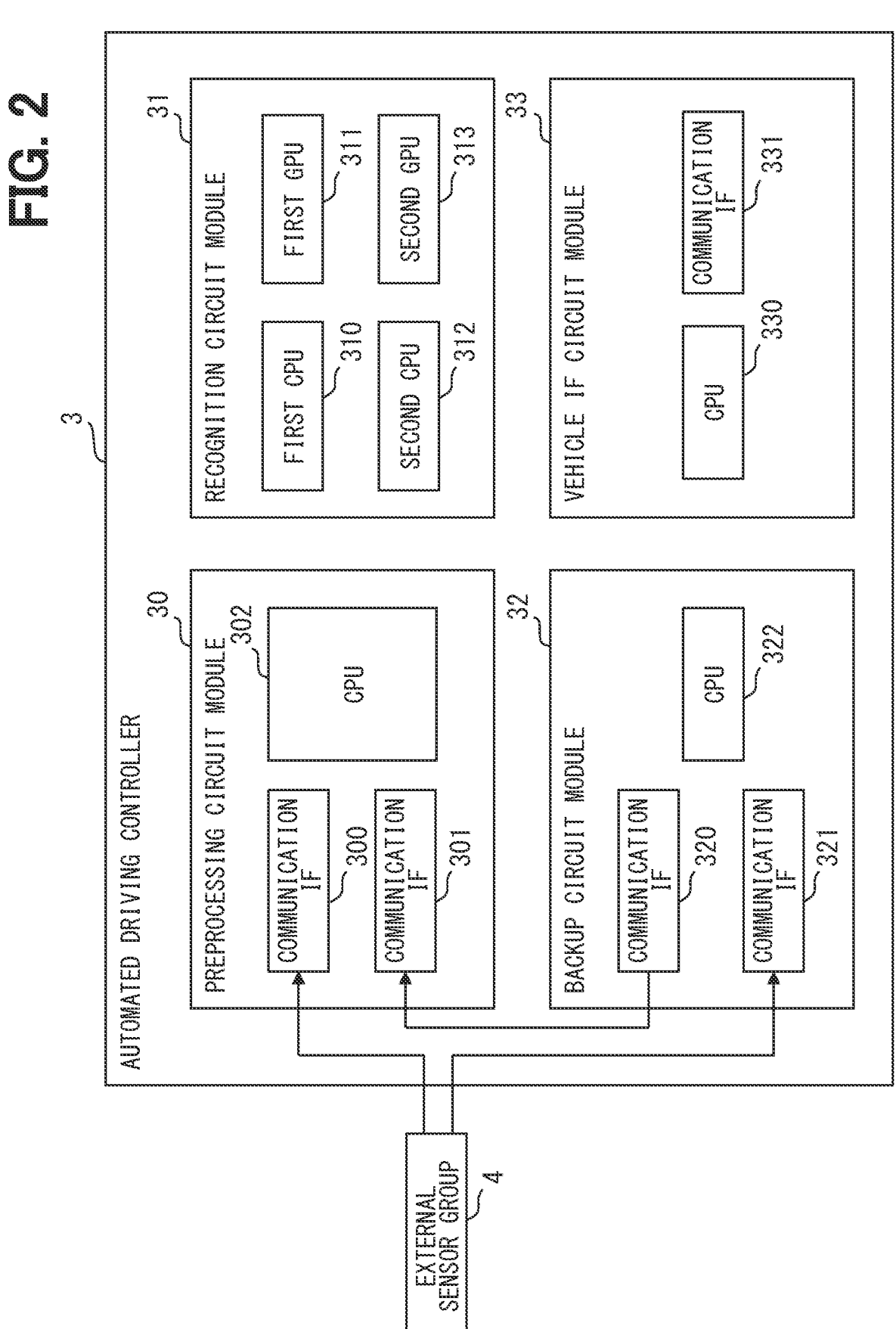
FIG. 2 is a block diagram illustrating a detail configuration of the automated driving controller according to the first embodiment.

As shown in FIG. 2, the automated driving controller 3 includes a preprocessing circuit module 30, a recognition circuit module 31, a backup circuit module 32, and a vehicle IF (interface) circuit module 33 as a plurality of circuit modules. Each circuit module includes at least one processor and one memory (not shown). These circuit modules 30, 31, 32, 33 are communicably connected to each other via at least one of a local area network (LAN) line, a wire harness, an internal bus, and a wireless communication line, for example.

The preprocessing circuit module 30 preprocesses sensor data obtained by sensing an external world by the external sensor group 4. The preprocessing circuit module 30 includes a communication interface 300, 301 and a central processing unit (CPU) 302. The communication interface 300 is directly connected to some external sensors of the external sensor group 4, and acquires sensor data from the connected external sensors. The communication interface 301 is connected to a communication interface 320 of the backup circuit module 32, which will be described later, and acquires sensor data from an external sensor of the external sensor group 4 that is not directly connected to the communication interface 300 via the backup circuit module 32, as will be described later.

The central processing unit 302 performs preprocessing on the sensor data acquired by the communication interface 300, 301. The central processing unit 302 integrates sensor data from the external sensors constituting the external sensor group 4 acquired through each communication interface 300, 301 at each synchronization timing between the external sensors as preprocessing before sending the sensor data to the recognition circuit module 31.

The communication interface 300, 301 and the central processing unit 302 that are formed as chips in the preprocessing circuit module 30 can be said to be heating elements that generate heat in association with processing. The communication interface 300, 301 and the central processing unit 302 have different amounts of heat generation associated with processing, and the central processing unit 302 has a higher amount of heat generation associated with processing than the communication interfaces 300, 301. As described above, in the preprocessing circuit module 30 that executes the relatively low-load processing of the preprocessing of the sensor data, the heat generation amount as a whole is lower than a heat generation amount of the recognition circuit module 31 described later.

The recognition circuit module 31 executes recognition processing and path planning processing based on the sensor data preprocessed by the preprocessing circuit module 30. As recognition processing, the recognition circuit module 31 grasps an external situation of the vehicle 2 and a situation in which the vehicle 2 is placed in the external situation from the sensor data integrated by the preprocessing circuit module 30. As a path planning process, the recognition circuit module 31 plans a travel path including a route and a trajectory along which the vehicle 2 will travel in the future. The path planning process may be executed by calculation such as simulation in order to control future traveling of the vehicle 2 according to the sensor data. The recognition circuit module 31 includes a first central processing unit 310 and a first graphics processing unit (GPU) 311, which jointly perform the recognition process and the path planning process.

The recognition circuit module 31 is redundantly designed to include a second central processing unit 312 provided to be able to perform processing in parallel with the first central processing unit 310 and a second graphics processing unit 313 provided to be able to perform processing in parallel with the first graphics processing unit 311. With such the redundant design, the recognition circuit module 31 executes the recognition process and the path planning process in parallel by the first central processing unit 310 and the first graphics processing unit 311, and the second central processing unit 312 and the second graphics processing unit 313. The recognition process and the path planning process can be continued by the second central processing unit 312 and the second graphics processing unit 313 when an abnormality occurs in at least one of the first central processing unit 310 and the first graphics processing unit 311. Conversely, the recognition process and the path planning process can be continued by the first central processing unit 310 and the first graphics processing unit 311 when an abnormality occurs in the second central processing unit 312 or the second graphics processing unit 313.

The central processing units 310, 312 and the graphics processing units 311, 313 formed as chips in the recognition circuit module 31 can be said to be heating elements that generate heat in association with processing. In the central processing units 310, 312 and the graphics processing units 311, 313 that execute relatively high-load processing such as the recognition processing and the path planning processing in parallel, the amount of heat generated by the processing is high. In particular, the graphics processing units 311,313 specialized in image processing in the recognition processing and the path planning processing generates a larger amount of heat than the central processing units 310, 312. Therefore, the heat generation amount of the recognition circuit module 31 as a whole is higher than that of the preprocessing circuit module 30, the backup circuit module 32, and the vehicle IF circuit module 33 in the automated driving controller 3, which will be described later.

The backup circuit module 32 executes a backup process of backing up at least one of the preprocessing circuit module 30 and the recognition circuit module 31. The backup circuit module 32 includes communication interfaces 320, 321 and a central processing unit 322. A communication interface 321 is connected to some external sensors of the external sensor group 4, and acquires sensor data from the connected external sensors. The sensor data acquired by the communication interface 321 is minimum sensor data necessary for backup processing. The sensor data acquired by the communication interface 321 is passed to the preprocessing circuit module 30 via the communication interface 320. The central processing unit 322 is configured to be able to substitute at least a part of the processing of the circuit modules 30 or 31 in which an abnormality has occurred when the abnormality occurs in at least one of the preprocessing circuit module 30 and the recognition circuit module 31.

The communication interfaces 320, 321 and the central processing unit 322, which are formed as chips in the backup circuit module 32, can be said to be heating elements that generate heat during processing. The communication interfaces 320, 321 and the central processing unit 322 have different amounts of heat generation associated with processing, and the central processing unit 322 has a higher amount of heat generation associated with processing than each communication interfaces 320, 321. As described above, in the backup circuit module 32 that executes a relatively low-load process of the backup process, the heat generation amount as a whole is lower than that of the recognition circuit module 31.

The vehicle IF circuit module 33 calculates a control target of the vehicle 2 based on the path plan calculated by the recognition circuit module 31, and outputs the control target to the control system 5. The vehicle IF circuit module 33 includes a central processing unit 330 that calculates a control target and a communication interface 331 that outputs the calculated control target to the control system 5. The central processing unit 330 and the communication interface 331 that are formed as chips in the vehicle IF circuit module 33 can be said to be heating elements that generate heat in association with processing. The central processing unit 330 and the communication interface 331 have different amounts of heat generation associated with processing, and the central processing unit 330 has a higher amount of heat generation associated with processing than the communication interface 331. As described above, in the vehicle IF circuit module 33 that executes a relatively low-load processing of the control target calculation of the vehicle 2, the heat generation amount as a whole is lower than the heat generation amount of the recognition circuit module 31.

Figure 3:
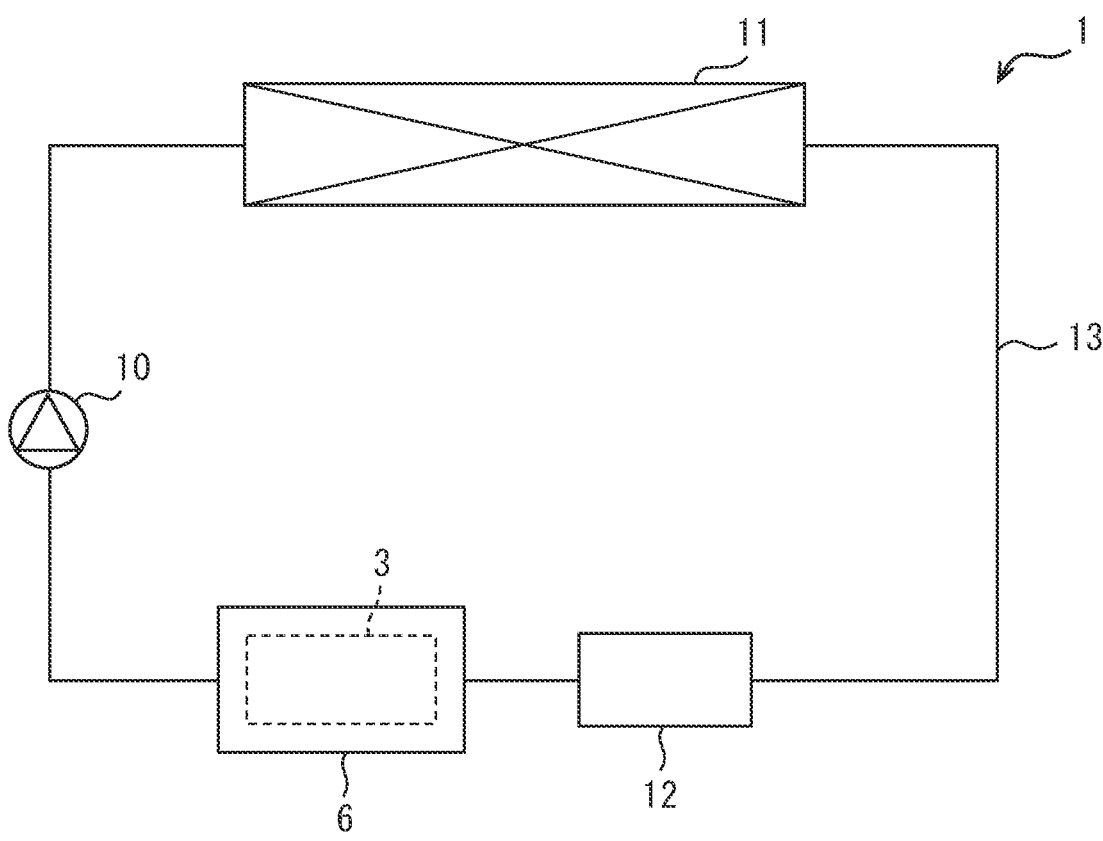
FIG. 3 is a schematic diagram illustrating a cooling system according to an embodiment.

The cooling system 1 shown in FIG. 3 includes a housing 6, a pump 10, a heat dissipation unit 11, a filter 12, and a pipe 13 in addition to the automated driving controller 3. The housing 6, the pump 10, the heat dissipation unit 11, and the filter 12 are connected via the pipe 13 to form a coolant circuit. The cooling system 1 cools the automated driving controller 3 accommodated in the housing 6 by an insulating liquid 8 circulating in the coolant circuit.

The insulating liquid 8 flows into the housing 6 accommodating the automated driving controller 3 to be cooled from the pipe 13 located upstream and is discharged to the pipe 13 located downstream to circulate in the cooling system 1. By the circulation, the insulating liquid 8 is contained in the housing 6 in a substantially constant volume. As the circulated insulating liquid 8, various immersion cooling coolants having insulating properties and high thermal conductivity can be used.

The pump 10 is, for example, a positive displacement pump or a non-positive displacement pump mainly including an electric motor unit, a pressure feeding unit, and the like. The pump 10 drives the pressure feeding unit by rotational force generated by the electric motor unit to pressure-feed the insulating liquid 8 inhaled from the upstream pipe 13 to the downstream pipe 13. The pump 10 circulates the insulating liquid 8 between the housing 6 and the heat dissipation unit 11 by pumping the insulating liquid 8.

The heat dissipation unit 11 is, for example, a radiator or the like that dissipates heat from the insulating liquid 8 to an outside air by heat exchange between the insulating liquid 8 in laminated tubes and the outside air outside the laminated tubes. The heat dissipation unit 11 is arranged, for example, in a front portion of the vehicle 2 to dissipate heat from the insulating liquid to the outside air.

The filter 12 is, for example, a mesh filter, a laminated filter, or a nonwoven fabric filter that collects foreign substance in the insulating liquid 8. The filter 12 is arrange upstream the housing 6 in the cooling system 1 to remove the foreign substance in the insulating liquid 8 flowing into the housing 6 from the pipe 13.

Figure 4:
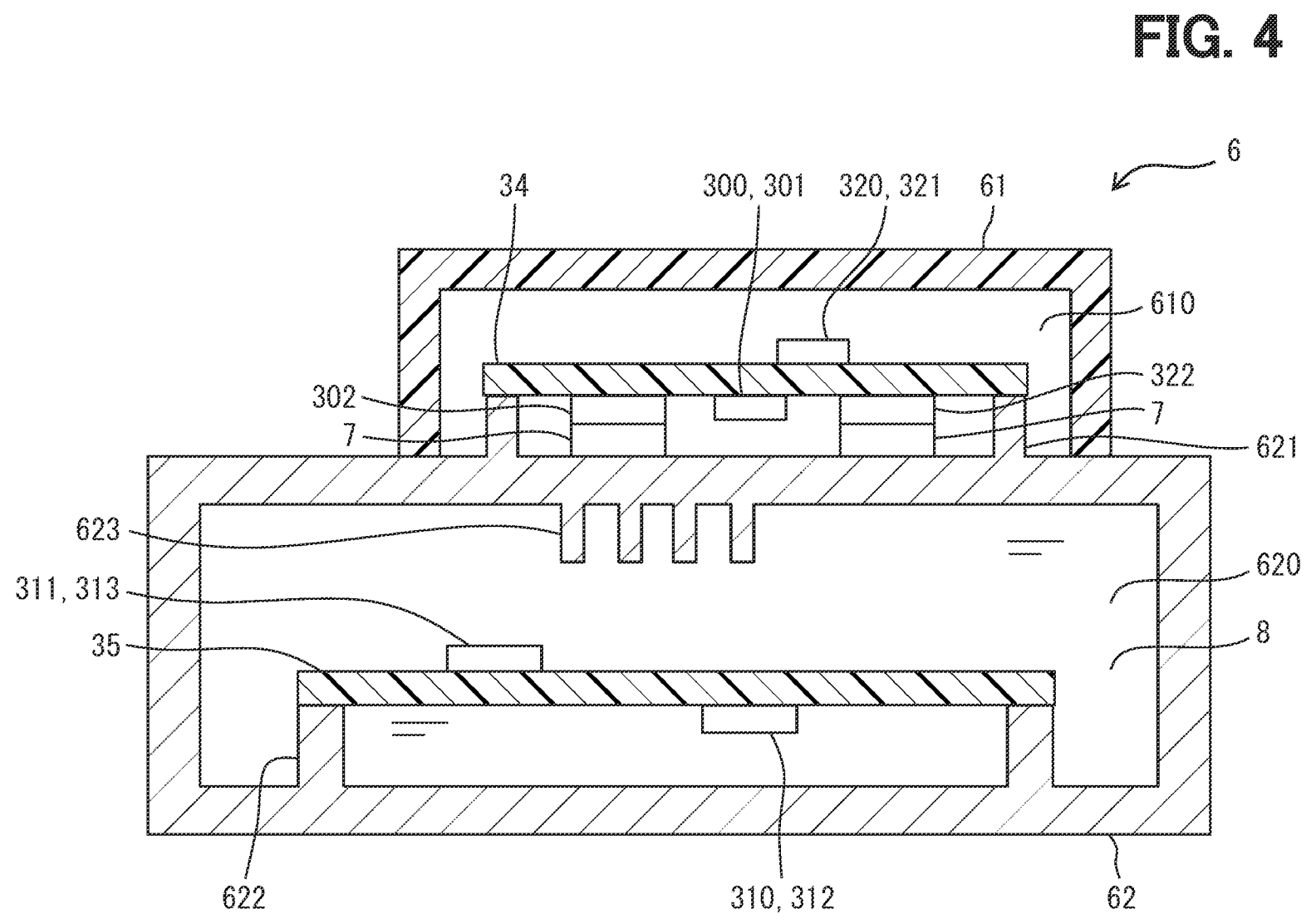

The housing 6 of the first embodiment shown in FIG. 4 includes an air chamber casing 61 defining an air chamber 610 inf the housing 6 and an immersion chamber casing 62 defining an immersion chamber 620 in the housing 6. The air chamber casing 61 is formed of a lightweight resin material from a viewpoint of reducing weight of the entire housing 6. Material of the air chamber casing 61 may be a lightweight metal material such as aluminum, for example, in addition to the resin material. On the other hand, the immersion chamber casing 62 is formed of a lightweight and highly thermally conductive metal material such as aluminum, for example, from a viewpoint of efficiently transferring heat from a heat conductor 7 to the insulating liquid 8 in addition to a viewpoint of reducing the weight of the entire housing 6.

The air chamber casing 61 has a cup shape with one open surface. An end portion on the open surface of the cup shape of the air chamber casing 61 is bonded to an outer upper surface of the immersion chamber casing 62. As a bonding method, various bonding methods such as bonding using an adhesive may be employed. The air chamber casing 61 is coupled to the immersion chamber casing 62 to form the air chamber 610 on the outer upper surface of the immersion chamber casing 62. An inside of the air chamber 610 defined by the air chamber casing 61 is filled with air. The air chamber casing 61 may be formed of a single member or may be formed by combining a plurality of members.

The air chamber 610 accommodates an air-cooled substrate 34 on which the preprocessing circuit module 30, the backup circuit module 32, and the vehicle IF circuit module 33 are mounted. The air-cooled substrate 34 is, for example, a printed circuit board or the like, and wiring patterns are formed on a front surface and a back surface of a base material having an insulating property. The air-cooled substrate 34 may be subjected to a corrosion resistant process against oxidation, such as a corrosion resistant coating. The air-cooled substrate 34 is placed on a protrusion 621 protruding from the outer upper surface of the immersion chamber casing 62, so as to be separated from the outer upper surface of the immersion chamber casing 62. The air-cooled substrate 34 is coupled to the protrusion 621 by a fastening member such as a screw (not shown). According to such an arrangement of the air-cooled substrate 34, the circuit modules 30, 32, 33 on the air-cooled substrate 34 are arranged outside the insulating liquid accommodated in the immersion chamber 620. Therefore, the circuit modules 30, 32, 33 on the air-cooled substrate 34 are air-cooled by the air in the air chamber 610.

Figure 5:
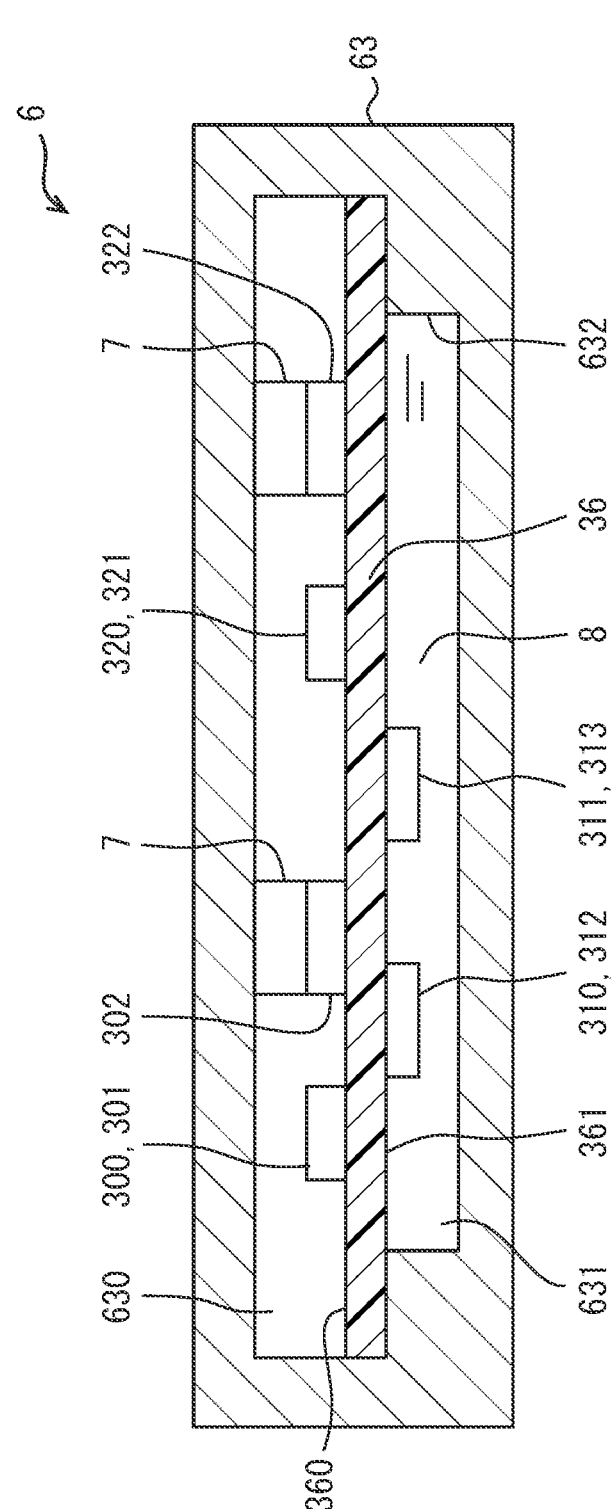
FIG. 5 is a cross-sectional view illustrating a housing and an automated driving controller according to a second embodiment.
Figure 6:
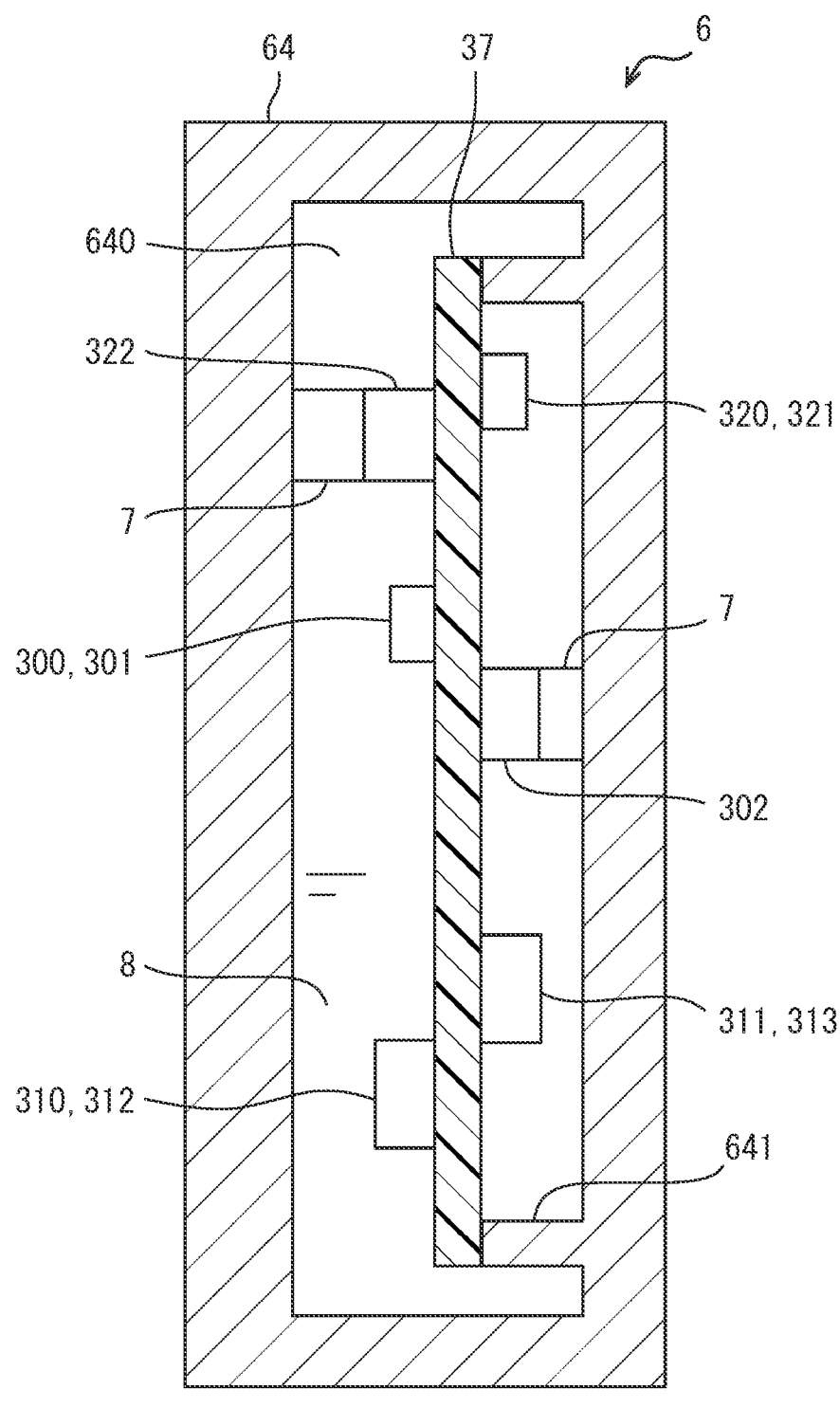
FIG. 6 is a cross-sectional view illustrating a housing and an automated driving controller according to a third embodiment.

Although illustration of the vehicle IF circuit module 33 is omitted in FIGS. 4 to 6, the vehicle IF circuit module 33 is arranged on the air-cooled substrate 34 similarly to the preprocessing circuit module 30 and the backup circuit module 32. The pipe 13 is not shown in FIGS. 4 to 6, the pipe 13 communicates with the inside of the immersion chamber 620 so that the insulating liquid 8 can be circulated between the immersion chamber 620 and the heat dissipation unit 11.

As shown in FIG. 4, the communication interfaces 300, 301, which are heat generating elements of the preprocessing circuit module 30 having a low heat generation amount, and the communication interfaces 320, 321, which are heat generating elements of the backup circuit module 32 having a low heat generation amount, are mounted on an upper mounting surface or a lower mounting surface of the air-cooled substrate 34. In addition, the communication interface 331, which is a heat generating element having a low heat generation amount in the vehicle IF circuit module 33 (not shown), is also mounted on the upper mounting surface or the lower mounting surface of the air-cooled substrate 34. With such a configuration, the communication interfaces 300, 301, 320, 321, 331 are air-cooled by the air in the air chamber 610.

On the other hand, the central processing unit 302, which is a heating element of the preprocessing circuit module 30 having a high heat generation amount, and the central processing unit 322, which is a heating element of the backup circuit module 32 having a high heat generation amount, are mounted on the lower mounting surface, which faces the outer upper surface of the immersion chamber casing 62, of the mounting surface of the air-cooled substrate 34. In addition, the central processing unit 330, which is a heat generating element having a high heat generation amount in the vehicle IF circuit module 33 (not shown), is also mounted on the lower mounting surface of the air-cooled substrate 34. Different heat conductors 7 are interposed between the central processing unit 302, 322, 330 and the outer upper surface of the immersion chamber casing 62. As each of the heat conductors 7, various heat conductors such as a thermal conductive gel or a thermal conductive sheet can be used. Each of the heat conductors 7 is connected to the central processing unit 302, 322, 330 and the immersion chamber casing 62 in a thermally conductive manner.

With such a configuration, the central processing units 302, 322, 330 are air-cooled by the air in the air chamber 610. Furthermore, the heat of the central processing units 302, 322, 330 are dissipated via the heat conductors 7 and the immersion chamber casing 62 to the insulating liquid 8 in the immersion chamber 620. In addition, heat dissipation fins 623 are provided on an inner upper surface of the immersion chamber casing 62 so as to promote heat conduction from the immersion chamber casing 62 to the insulating liquid 8. The heat dissipation fins 623 may be formed as a part of the immersion chamber casing 62. Alternatively, the heat dissipation fins 623 may be formed separately from the immersion chamber casing 62 and may be installed on the inner upper surface of the immersion chamber casing 62.

The immersion chamber casing 62 has a substantially rectangular parallelepiped shape defining the immersion chamber 620 isolated from the air chamber 610. The immersion chamber 620 defined by the immersion chamber casing 62 is filled with the insulating liquid 8 circulating through the pipe 13 as described above. A shape of the immersion chamber casing 62 is not limited to the rectangular parallelepiped shape as long as the immersion chamber 620 is defined inside. The immersion chamber casing 62 may have, for example, a cylindrical shape. The immersion chamber casing 62 is formed by joining a plurality of members. In FIG. 4, illustration of each member forming the immersion chamber casing 62 is omitted.

An immersion substrate 35 on which the central processing units 310, 312 of the recognition circuit module 31 and the graphics processing unit 311,313 are mounted is accommodated in the immersion chamber 620. The immersion substrate 35 is placed on a protrusion 622 protruding from an inner lower surface of the immersion chamber casing 62, and thus is arranged away from the inner lower surface of the immersion chamber casing 62. The immersion substrate 35 is coupled to the protrusion 622 by a fastening member such as a screw (not shown). The insulating liquid 8 radiated by the heat dissipation unit 11 flows into the immersion chamber 620. The immersion substrate 35 can be entirely immersed in the insulating liquid 8 by being arranged in the immersion chamber 620 in which the insulating liquid 8 is accommodated. By immersing the immersion substrate 35 in the insulating liquid 8, the recognition circuit module 31 on the immersion substrate 35 is cooled. The immersion substrate 35 is, for example, a printed circuit board or the like, and wiring patterns are formed on a front surface and a back surface of a base material having an insulating property. The immersion substrate 35 is subjected to a corrosion resistant process with respect to the insulating liquid 8, such as a corrosion resistant coating.

Actions and Effects

The actions and effects of the first embodiment described above will be described below.

In the first embodiment, in the automated driving controller 3, the preprocessing circuit module 30 is arranged outside the insulating liquid 8, and the recognition circuit module 31 is immersed in the insulating liquid 8. According to this, the recognition circuit module 31 that executes the relatively high-load processing of the recognition processing of the outside world can be liquid-cooled by being immersed in the insulating liquid 8, and the preprocessing circuit module 30 that executes the relatively low-load processing of the preprocessing of the sensor data can be air-cooled by being arranged outside the insulating liquid 8. Therefore, the required amount of insulating liquid can be reduced and the automated driving controller 3 can be efficiently cooled as compared to a case where the entire automated driving controller 3 is liquid cooled.

The preprocessing circuit module 30 of the first embodiment includes heating elements having different amounts of heat generated by preprocessing. Therefore, the central processing unit 302, which is a heat generating element having a higher heat generation amount among the heat generating elements, and the housing 6 are connected to the heat conductor 7 so as to be thermally conductive. According to this configuration, heat from the heating element having the high heating value element in the preprocessing circuit module 30 can be conducted to the insulating liquid 8 via the heat conductor 7 and the housing 6. Therefore, even in a case where the preprocessing circuit module 30 is to be cooled by air, the heat generation element having the high heat generation amount can be cooled by using heat conduction from the outside of the insulating liquid 8 to the insulating liquid 8. Therefore, the required amount of insulating liquid can be reduced and the automated driving controller 3 can be efficiently cooled, as compared to a case where liquid cooling is performed including the heating elements on the high heating value element in the preprocessing circuit module 30.

In the first embodiment, the recognition circuit module 31 is arranged in the immersion chamber 620 separated from the air chamber 610 in which the preprocessing circuit module 30 is arranged. According to this, by accommodating the insulating liquid 8 only in the immersion chamber 620 in which the recognition circuit module 31 is arranged, the required amount of insulating liquid can be reduced as compared to a case where the insulating liquid 8 is accommodated the air chamber 610 in which the preprocessing circuit module 30 is arranged. Therefore, the automated driving controller 3 can be efficiently cooled.

In the first embodiment, the housing 6 includes the air chamber casing 61 that defines the air chamber 610 and the immersion chamber casing 62 that defines the immersion chamber 620. According to this, in the configuration in which the circuit modules 30, 31, 32, 33 of the automated driving controller 3 are physically separated, the insulating liquid 8 is stored only in the immersion chamber 620 in which the recognition circuit module 31, which is one of the circuit modules 30, 31, 32, 33, is disposed, and thus the necessary amount of the insulating liquid can be reduced. Therefore, the automated driving controller 3 can be efficiently cooled.

In the first embodiment, the backup circuit module 32 that backs up at least one of the preprocessing circuit module 30 and the recognition circuit module 31 is arranged outside the insulating liquid 8 in the housing 6 to be accommodated. According to this configuration, the backup circuit module 32 that executes the backup process, which is a process with a relatively low load, can also be air-cooled similarly to the preprocessing circuit module 30. Therefore, compared to a case where the backup circuit module 32 is also liquid-cooled, the required amount of insulating liquid can be reduced and the automated driving controller 3 can be efficiently cooled.

The backup circuit module 32 according to the first embodiment includes heating elements having different amounts of heat generated in the backup process. Therefore, the central processing unit 322, which is a heat generating element having a high heat generation amount among the heat generating elements, and the housing 6 are connected to the heat conductor 7 so as to be thermally conductive. According to this configuration, heat from the heating element having the high heating value in the backup circuit module 32 can be conducted to the insulating liquid 8 via the heat conductor 7 and the housing 6. Therefore, even in the backup circuit module 32 cooled by air, the heating element having the high heating value can be cooled by utilizing heat conduction from the outside of the insulating liquid 8 to the insulating liquid 8. Therefore, the required amount of insulating liquid can be reduced and the automated driving controller 3 can be efficiently cooled, as compared to a case where liquid cooling is performed including the heating elements having the high heating value in the backup circuit module 32.

In the first embodiment, the recognition circuit module 31 is arranged in the immersion chamber 620 separated from the air chamber 610 in which the backup circuit module 32 is arranged. According to this, by accommodating the insulating liquid 8 only in the immersion chamber 620 in which the recognition circuit module 31 is arranged, the required amount of insulating liquid can be reduced as compared to a case where the insulating liquid 8 is accommodated the air chamber 610 in which the backup circuit module 32 is arranged. Therefore, the automated driving controller 3 can be efficiently cooled.

In the first embodiment, the vehicle IF circuit module 33 is arranged in the same manner as the backup circuit module 32. Therefore, the effects obtained by the above-described arrangement of the backup circuit module 32 can be similarly obtained by the arrangement of the vehicle IF circuit module 33.

The heat dissipation unit 11 of the first embodiment dissipates heat from the insulating liquid 8 in the housing 6. Accordingly, the heat conducted from the recognition circuit module 31 to the insulating liquid 8 can be released outside the housing 6. Therefore, the automated driving controller 3 can be effectively cooled by maintaining the cooling effect of the recognition circuit module 31 using the insulating liquid 8.

In the first embodiment, the backup circuit module 32 preprocesses sensor data acquired from a part of the external sensor group 4 as backup processing of the preprocessing circuit module 30. According to this, the backup circuit module 32 substitutes a part of the preprocessing by the preprocessing circuit module 30 when an abnormality occurs in the preprocessing circuit module 30, and thus the automated driving control of the vehicle 2 can be continued.

In the first embodiment, the recognition circuit module 31 to be liquid-cooled includes the graphics processing unit 311 which is a heating element having a high amount of heat generated by processing. According to this, the automated driving controller 3 can be cooled by performing liquid cooling including the graphics processing unit 311 having a high heat generation amount.

In the first embodiment, the liquid-cooled recognition circuit module 31 includes the second graphics processing unit 313 to perform parallel processing with the first graphics processing unit 311. According to this, the external recognition processing and the path planning processing can be executed in parallel by the first and second graphics processing units 311, 313. In addition, even in a case where an abnormality occurs in one of the first and second graphics processing units 311, 313, the recognition processing of the outside world and the path planning processing can be continued by the other of the first and second graphics processing units in which no abnormality occurs. In addition, since the second graphics processing unit 313 having a high heat generation amount is liquid-cooled, the automated driving controller 3 can be efficiently cooled.

In the first embodiment, the recognition circuit module 31 to be liquid-cooled includes the central processing unit 310, which is a heating element having a high amount of heat generated by processing. According to this, the automated driving controller 3 can be efficiently cooled by performing liquid cooling including the central processing unit 310 having a high heat generation amount.

In the first embodiment, the liquid-cooled recognition circuit module 31 includes a second central processing unit 312 to perform parallel processing with the first central processing unit 310. According to this, the recognition processing of the outside world and the path planning processing can be executed in parallel by the first and second central processing units 310, 312. As a result, even when an abnormality occurs in one of the first and second central processing units 310, 312, the external recognition process and the path planning process can be continued by the other central processing unit in which no abnormality has occurred. In addition, since the second central processing unit 312 having a high heat generation amount is liquid-cooled, the automated driving controller 3 can be efficiently cooled.

In the first embodiment, the liquid-cooled recognition circuit module 31 executes the path planning process. According to this, the automated driving controller 3 can be efficiently cooled by liquid-cooling the recognition circuit module 31 that executes a relatively high-load process of the path planning process.

Second Embodiment

As shown in FIG. 5, a second embodiment is a modification of the first embodiment. In the second embodiment, configurations of an automated driving controller 3 and a housing 6 are different from those in the first embodiment.

The housing 6 of the second embodiment includes a common casing 63 shown in FIG. 5. The common casing 63 is formed of a lightweight and highly thermally conductive metal material such as aluminum from a viewpoint of reducing weight of the entire housing 6 and from a viewpoint of efficiently transferring heat from the heat conductor 7 to the insulating liquid 8.

The common casing 63 has a substantially rectangular parallelepiped shape defining an air chamber 630 and an immersion chamber 631 therein. A shape of the common casing 63 is not limited to the rectangular parallelepiped shape as long as the air chamber 630 and the immersion chamber 631 can be defined inside. The common casing 63 may have, for example, a cylindrical shape. The common casing 63 is formed by joining a plurality of members. In FIG. 5, illustration of each member forming the common casing 63 is omitted.

A common substrate 36 on which the circuit modules 30, 31, 32, 33 of the automated driving controller 3 are mounted is accommodated in the common casing 63. The common substrate 36 is, for example, a printed circuit board or the like, and wiring patterns are formed on a front surface and a back surface of a base material having an insulating property. The common substrate 36 may be subjected to a corrosion resistant process such as, for example, a corrosion resistant coating against oxidation or the insulating liquid 8.

The common substrate 36 is arranged in the common casing 63 such that a first mounting surface 360 faces upward in a vertical direction and a second mounting surface 361 faces downward in the vertical direction in a mounted state on the vehicle 2. The common substrate 36 is placed on a step portion 632 such that a peripheral edge portion of the second mounting surface 361 continuously comes into contact with an annular step portion 632 protruding from an inner lower surface of the common casing 63 in a circumferential direction. The common substrate 36 is coupled to the step portion 632 by, for example, a fastening member such as a screw (not illustrated). An O-ring (not shown) is arranged between the common substrate 36 and the step portion 632, so that the second mounting surface 361 and an end surface of the step portion 632 are sealed in a liquid-tight manner. With such an arrangement of the common substrate 36, the air chamber 630 is defined by the first mounting surface 360 and the common casing 63 above the common substrate 36 in the common casing 63. On the other hand, below the common substrate 36 in the common casing 63, the second mounting surface 361 and the common casing 63 define an immersion chamber 631 in which the insulating liquid 8 is stored.

The housing 6 having the common casing 63, the pump 10, the heat dissipation unit 11, and the filter 12 of the second embodiment are connected via the pipe 13 as in the first embodiment to form a coolant circuit. Although illustration of the pipe 13 is omitted in FIG. 5, the pipe 13 communicates with the inside of the liquid-tight immersion chamber 631 so that the insulating liquid 8 can be circulated between the immersion chamber 631 and the heat dissipation unit 11. In such a configuration, the insulating liquid 8 circulates between the immersion chamber 631 in the common casing 63 and the heat dissipation unit 11 by being pumped by the pump 10. At this time, the insulating liquid 8 flows into the immersion chamber 631 after foreign substance are removed by the filter 12 arranged upward the common casing 63.

The preprocessing circuit module 30, the backup circuit module 32, and the vehicle IF circuit module 33 among the circuit modules 30, 31, 32, 33 of the automated driving controller 3 are mounted on the first mounting surface 360 defining the air chamber 630. On the other hand, the recognition circuit module 31 is mounted on the second mounting surface 361 defining the immersion chamber 631.

In such a configuration, each of the circuit modules 30, 32, 33 on the first mounting surface 360 is arranged outside the insulating liquid 8 by being accommodated in the air chamber 630, and thus is air-cooled by the air in the air chamber 630. On the other hand, the recognition circuit module 31 on the second mounting surface 361 is placed in the insulating liquid 8 by being accommodated in the immersion chamber 631, and thus is cooled by being immersed in the insulating liquid 8.

A heat conductor 7 is interposed between the central processing unit 302, which is a heat generating element having a high heat generating amount in the preprocessing circuit module 30, and the inner upper surface of the common casing 63. Another heat conductor 7 is interposed between the central processing unit 322, which is a heat generating element having a high heat generation in the backup circuit module 32, and the inner upper surface of the common casing 63. A further heat conductor 7 is interposed between the central processing unit 330, which is a heat generating element having a high heat generation amount (not shown) in the vehicle IF circuit module 33, and the inner upper surface of the common casing 63. Each heat conductor 7 is connected to the central processing unit 302, 322, 330 and the common casing 63 so as to be thermally conductive. By these heat conductors 7, the heat of the central processing unit 302, 322, 330 is dissipated via the common casing 63 to the insulating liquid 8 in the immersion chamber 631.

Actions and Effects

The operation and effect of the second embodiment described above will be described below.

In the second embodiment, the preprocessing circuit module 30 is mounted on the first mounting surface 360 of the common substrate 36, while the recognition circuit module 31 is mounted on the second mounting surface 361 opposite to the first mounting surface 360. Therefore, the air chamber 630 is defined by the first mounting surface 360 of the common substrate 36 and the common casing 63, and the immersion chamber 631 is defined by the second mounting surface 361 and the common casing 63. According to this, by applying the liquid cooling only to the immersion chamber 631 on the second mounting surface 361 on which the recognition circuit module 31 is mounted, the required amount of the insulating liquid can be reduced as compared to a case where the liquid cooling is also applied to the first mounting surface 360 on which the preprocessing circuit module 30 is mounted. Therefore, the automated driving controller 3 can be efficiently cooled.

In the second embodiment, the backup circuit module 32 is mounted on the first mounting surface 360 of the common substrate 36, while the recognition circuit module 31 is mounted on the second mounting surface 361 opposite to the first mounting surface 360. Therefore, the air chamber 630 is defined by the first mounting surface 360 of the common substrate 36 and the common casing 63, and the immersion chamber 631 is defined by the second mounting surface 361 and the common casing 63. According to this, by applying the liquid cooling only to the immersion chamber 631 on the second mounting surface 361 on which the recognition circuit module 31 is mounted, the required amount of the insulating liquid can be reduced as compared to a case where the liquid cooling is also applied to the first mounting surface 360 on which the backup circuit module 32 is mounted. Therefore, the automated driving controller 3 can be efficiently cooled.

In the second embodiment, the vehicle IF circuit module 33 is mounted on the first mounting surface 360 of the common substrate 36, while the recognition circuit module 31 is mounted on the second mounting surface 361 opposite to the first mounting surface 360. Therefore, the air chamber 630 is defined by the first mounting surface 360 of the common substrate 36 and the common casing 63, and the immersion chamber 631 is defined by the second mounting surface 361 and the common casing 63. According to this, by applying the liquid cooling only to the immersion chamber 631 on the second mounting surface 361 on which the recognition circuit module 31 is mounted, the required amount of the insulating liquid can be reduced as compared to a case where the liquid cooling is also applied to the first mounting surface 360 on which the vehicle IF circuit module 33 is mounted. Therefore, the automated driving controller 3 can be efficiently cooled.

Third Embodiment

A third embodiment shown in FIG. 6 is a modification of the first embodiment. In the third embodiment, configurations of an automated driving controller 3 and a housing 6 are different from those in the first embodiment.

The housing 6 of the third embodiment includes a common casing 64 shown in FIG. 6. The common casing 64 is formed of a lightweight and highly thermally conductive metal material such as aluminum from a viewpoint of reducing weight of the entire housing 6 and from a viewpoint of efficiently transferring heat from the heat conductor 7 to the insulating liquid 8. The common casing 64 has a substantially rectangular parallelepiped shape defining a common chamber 640 therein. A shape of the common casing 64 is not limited to the rectangular parallelepiped shape as long as the common chamber 640 is defined inside. The common casing 64 may have, for example, a cylindrical shape. The common casing 64 is formed by joining a plurality of members. In FIG. 6, illustration of each member forming the common casing 64 is omitted.

A common substrate 37 on which the circuit modules 30, 31, 32, 33 of the automated driving controller 3 are mounted is accommodated in the common chamber 640. The common substrate 37 is, for example, a printed circuit board or the like, and wiring patterns are formed on a front surface and a back surface of a base material having an insulating property. The common substrate 37 may be subjected to a corrosion resistant process such as a corrosion resistant coating against oxidation and the insulating liquid 8. The insulating liquid 8 is contained in the common chamber 640 in a volume smaller than a volume of the common chamber 640. The insulating liquid 8 may be contained in the common chamber 640 by an amount that allows the recognition circuit module 31 to be immersed therein.

The housing 6 having the common casing 64, the pump 10, the heat dissipation unit 11, and the filter 12 of the third embodiment are connected via the pipe 13 as in the first and second embodiments to form a coolant circuit. Although illustration of the pipe 13 is omitted in FIG. 6, the pipe 13 communicates with the inside of the liquid-tight common chamber 640 so that the insulating liquid 8 can be circulated between the common chamber 640 and the heat dissipation unit 11. In such a configuration, the insulating liquid 8 circulates between the common chamber 640 in the common casing 64 and the heat dissipation unit 11 by being pumped by the pump 10. At this time, the insulating liquid 8 flows into the common chamber 640 after foreign substance are removed by the filter 12 arranged upward the common casing 64.

The common substrate 37 is coupled to a protrusion 641 protruding from an inner lateral surface of the common casing 64 such that a first region is positioned downward in a vertical direction with respect to a second region. As a method of coupling, for example, coupling by a fastening member such as a screw (not illustrated) can be adopted. In such an arrangement of the common substrate 37, the first region is immersed in the insulating liquid 8, and the second region is located in an atmospheric space above the insulating liquid 8.

The recognition circuit module 31 of the circuit modules 30, 31, 32, 33 is mounted in the first region immersed in the insulating liquid 8. Contrary to this, the other circuit modules 30, 32, 33 are mounted in the second region located in the atmospheric space above the insulating liquid 8.

A heat conductor 7 is interposed between the central processing unit 302, which is a heat generating element having a high heat generating amount in the preprocessing circuit module 30, and the inner lateral surface of the common casing 64. Another heat conductor 7 is interposed between the central processing unit 322, which is a heat generating element having a high heat generation in the backup circuit module 32, and the inner lateral surface of the common casing 64. A further heat conductor 7 is interposed between the central processing unit 330, which is a heat generating element having a high heat generation amount (not shown) in the vehicle IF circuit module 33, and the inner lateral surface of the common casing 64. Each heat conductor 7 is connected to the central processing unit 302, 322, 330 and the common casing 64 so as to be thermally conductive. By these heat conductors 7, the heat of the central processing unit 302, 322, 330 is dissipated via the common casing 64 to the insulating liquid 8.

Actions and Effects

Hereinbelow, effects of the above third embodiment will be described.

In the third embodiment, the preprocessing circuit module 30 and the recognition circuit module 31 are mounted on the common substrate 37. Further, the common substrate 37 is arranged such that the preprocessing circuit module 30 is located in the atmospheric space above the insulating liquid 8 and the recognition circuit module 31 is immersed in the insulating liquid 8. According to this, by applying the liquid cooling only to a region of the common substrate 37 where the recognition circuit module 31 is arranged, the required amount of the insulating liquid can be reduced as compared to a case where the entire common substrate 37 is liquid cooled. Therefore, the automated driving controller 3 can be efficiently cooled.

In the third embodiment, the backup circuit module 32 and the recognition circuit module 31 are mounted on the common substrate 37. Further, the common substrate 37 is arranged such that the backup circuit module 32 is located in the atmospheric space above the insulating liquid 8 and the recognition circuit module 31 is immersed in the insulating liquid 8. According to this, by applying the liquid cooling only to a region of the common substrate 37 where the recognition circuit module 31 is arranged, the required amount of the insulating liquid can be reduced as compared to a case where the entire common substrate 37 is liquid cooled. Therefore, the automated driving controller 3 can be efficiently cooled.

In the third embodiment, the vehicle IF circuit module 33 and the recognition circuit module 31 are mounted on the common substrate 37. Further, the common substrate 37 is arranged such that the vehicle IF circuit module 33 is located in the atmospheric space above the insulating liquid 8 and the recognition circuit module 31 is immersed in the insulating liquid 8. According to this, by applying the liquid cooling only to a region of the common substrate 37 where the recognition circuit module 31 is arranged, the required amount of the insulating liquid can be reduced as compared to a case where the entire common substrate 37 is liquid cooled. Therefore, the automated driving controller 3 can be efficiently cooled.

Other Embodiments

While some embodiments of the present disclosure have been described above, the present disclosure should not be interpreted to be limited to these embodiments, and can be applied to various other embodiments and combinations thereof without departing from the scope of the subject matter of the present disclosure.

Figure 7:
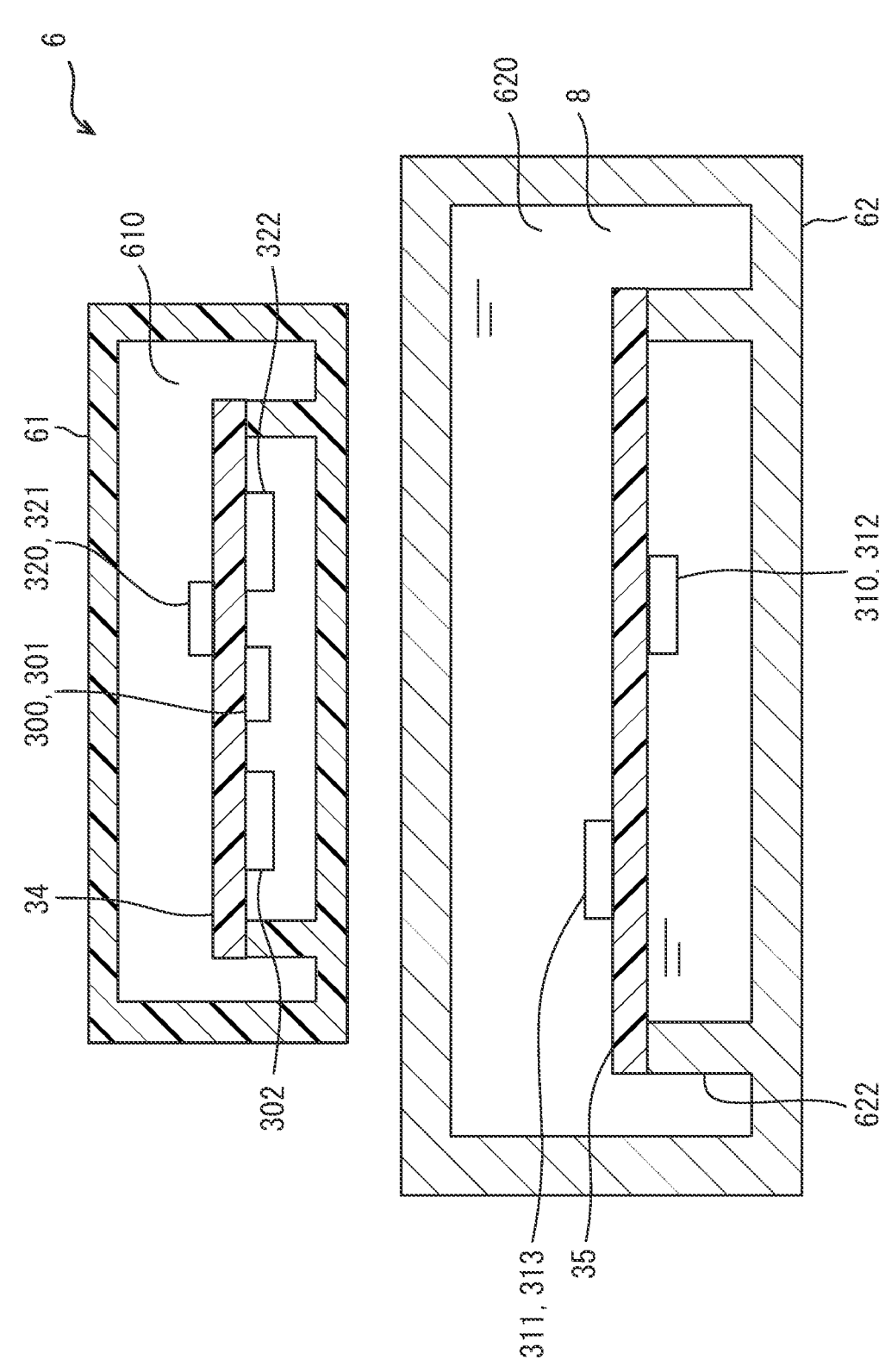
FIG. 7 is a cross-sectional view illustrating a housing and an automated driving controller according to another embodiment.

In a modification of the first embodiment shown in FIG. 7, an air chamber casing 61 and an immersion chamber casing 62 may be disposed separately from each other without being coupled to each other. Even in a configuration in which the modules of the automated driving controller 3 are physically separated as in this modification, the required amount of insulating liquid can be reduced by accommodating the insulating liquid 8 only in the immersion chamber 620 in which the recognition circuit module 31, which is one of the separation modules, is arranged. Therefore, the automated driving controller 3 can be efficiently cooled.

In a modification of the first embodiment, an air-cooled substrate 34 may be divided into a plurality of pieces. In this modification, the divided air-cooled substrate 34 may be individually accommodated in the plurality of divided air chamber casings 61. In a modification of the first embodiment, an immersion substrate 35 may be divided into a plurality of pieces. In this case, the divided immersion substrates 35 may be individually accommodated in the plurality of divided immersion chamber casings 62. In a modification of the second embodiment, a common substrate 36 may be divided into a plurality of pieces. In this case, the divided common substrate 36 may be individually accommodated in each of the plurality of divided common casings 63. In a modification of the third embodiment, a common substrate 37 may be divided into a plurality of pieces. In this case, the divided common substrate 37 may be individually accommodated in each of the plurality of divided common casings 64.

In a cooling system 1 according to a modification of the first, second, and third embodiments, some of the circuit modules 30, 32, 33 may be liquid cooled by being immersed in insulating liquid 8. A cooling system 1 according to a modification of the first, second, and third embodiments may have a configuration in which a central processing unit 302, 322, 330 is cooled only by air cooling without including a heat conductor 7. A preprocessing circuit module 30 according to a modification of the first, second, and third embodiments may be directly connected to all external sensors included in an external sensor group 4 and configured to acquire all sensor data. A recognition circuit module 31 according to a modification of the first, second, and third embodiments may not include a second central processing unit 312 and a second graphics processing unit 313.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A cooling system configured to cool an automated driving controller that executes processing related to automated driving control of a vehicle, the cooling system comprising:

the automated driving controller including a preprocessing circuit module configured to preprocess sensor data obtained by sensing an external environment of the vehicle, and a recognition circuit module configured to execute recognition processing of the external environment based on the preprocessed sensor data; and a housing accommodating the preprocessing circuit module and the recognition circuit module together with an insulating liquid, wherein the preprocessing circuit module is configured to be air-cooled by placement outside the insulating liquid, and the recognition circuit module is configured to be cooled by immersion in the insulating liquid.

2. The cooling system according to claim 1, further comprising, a heat conductor connected to the housing in a thermally conductive manner, wherein the preprocessing circuit module includes heating elements respectively having different amounts of heat generated by the preprocessing, and at least one of the heating elements having a higher amount of heat generated among the heating elements is connected to the heat conductor in the thermally conductive manner.

3. The cooling system according to claim 1, wherein the housing includes an immersion chamber accommodating the insulating liquid, and an air chamber isolated from the immersion chamber, the preprocessing circuit module is arranged in the air chamber, and the recognition circuit module is arranged in the immersion chamber.

4. The cooling system according to claim 3, wherein the housing includes an air chamber casing defining the air chamber and an immersion chamber casing defining the immersion chamber, and the air chamber casing and the immersion chamber casing are coupled to each other.

5. The cooling system according to claim 3, wherein the housing includes an air chamber casing defining the air chamber and an immersion chamber casing defining the immersion chamber, and the air chamber casing and the immersion chamber casing are separated from each other.

6. The cooling system according to claim 3, further comprising a common substrate having a first mounting surface and a second mounting surface opposite to the first mounting surface, the preprocessing circuit module is mounted on the first mounting surface, the recognition circuit module is mounted on the second mounting surface, the housing includes a common casing accommodating the common substrate, the air chamber is defined by the common casing and the first mounting surface, and the immersion chamber is defined by the common casing and the second mounting surface.

7. The cooling system according to claim 1, further comprising a common substrate on which the preprocessing circuit module and the recognition circuit module are mounted, wherein the housing defines a common chamber in which the insulating liquid and the common substrate are accommodated, the preprocessing circuit module is located in an atmospheric space above the insulating liquid in the common chamber, and the recognition circuit module is located in the insulating liquid in the common chamber.

8. The cooling system according to claim 1, wherein the automated driving controller further includes a backup circuit module configured to perform a backup process on at least one of the preprocessing circuit module and the recognition circuit module, and the backup circuit module is arranged outside the insulating liquid in the housing so that the backup circuit module is configured to be air-cooled.

9. The cooling system according to claim 8, wherein the preprocessing circuit module is configured to preprocess sensor data acquired from external sensors, and the backup circuit module is configured to preprocess sensor data acquired from some of the external sensors as the backup process of the preprocessing circuit module.

10. The cooling system according to claim 1, wherein the recognition circuit module includes a graphics processing unit.

11. The cooling system according to claim 10, wherein the graphics processing unit is a first graphics processing unit, and the recognition circuit module includes a second graphics processing unit configured to perform parallel processing with the graphics processing unit.

12. The cooling system according to claim 10, wherein the recognition circuit module includes a central processing unit configured to perform cooperative processing with the graphics processing unit.

13. The cooling system according to claim 12, wherein the central processing unit is a first central processing unit, and the recognition circuit module includes a second central processing unit configured to perform parallel processing with the central processing unit.

14. The cooling system according to claim 1, wherein the recognition circuit module is configured to further perform a path planning process based on the preprocessed sensor data.

15. The cooling system according to claim 1, further comprising a heat dissipation unit configured to dissipate heat from the insulating liquid circulated with the housing.

* * * * *